United States Patent
Natori

(12) United States Patent (10) Patent No.: US 6,917,062 B2
Natori (45) Date of Patent: Jul. 12, 2005

(54) FERROELECTRIC MEMORY DEVICE

(75) Inventor: Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 115 days.

(21) Appl. No.: 10/376,278

(22) Filed: Mar. 3, 2003

(65) Prior Publication Data

US 2004/0173826 A1 Sep. 9, 2004

(51) Int. Cl.[7] .............................................. H01L 29/76
(52) U.S. Cl. ........................................ 257/295; 257/296
(58) Field of Search ................................ 257/295, 296, 257/300, 5, 298, 278, 390

(56) References Cited

U.S. PATENT DOCUMENTS 5,880,991 A * 3/1999 Hsu et al. .................. 365/182

* cited by examiner

*Primary Examiner*—David Nelms
*Assistant Examiner*—Thinh T Nguyen
(74) *Attorney, Agent, or Firm*—Oliff & Berridge, PLC

(57) ABSTRACT

A ferroelectric memory device and a method of manufacturing the memory device are provided that facilitate the formation of different types of a plurality of memories on an identical substrate.

A ferroelectric memory device includes a first ferroelectric memory and a second ferroelectric memory. The first ferroelectric memory includes a first memory cell array. The second ferroelectric memory includes a second memory cell array. In the first memory cell array, memory cells are arranged in a matrix manner, and the first memory cell array includes first signal electrodes, second signal electrodes extending in the direction intersecting the first signal electrodes, and a ferroelectric layer at least between the first signal electrodes and the second signal electrodes. The second ferroelectric memory includes a different type of memory cells from that of the memory cells of the first ferroelectric memory.

8 Claims, 16 Drawing Sheets

FIG.3
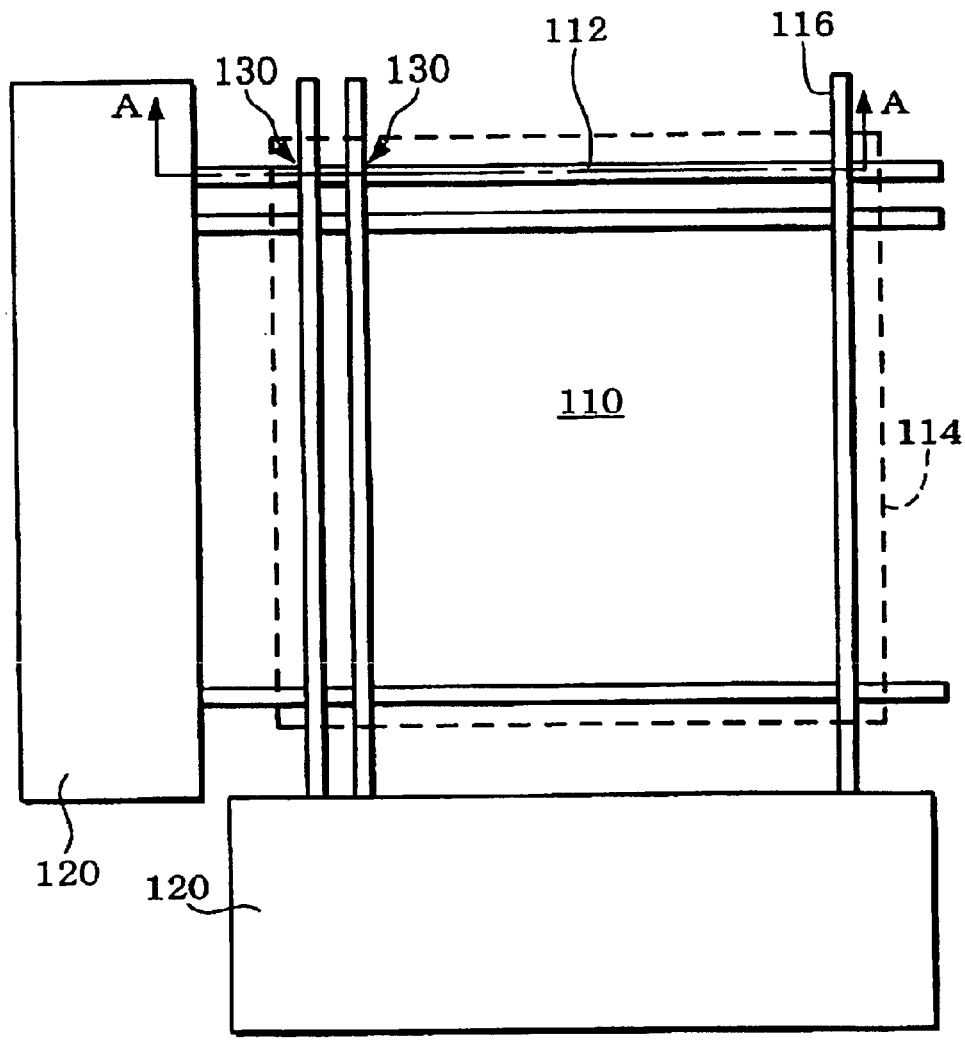
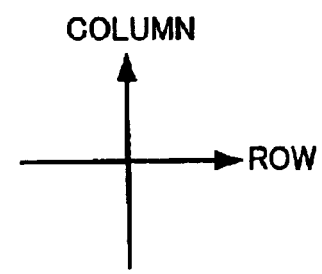

FIG.4
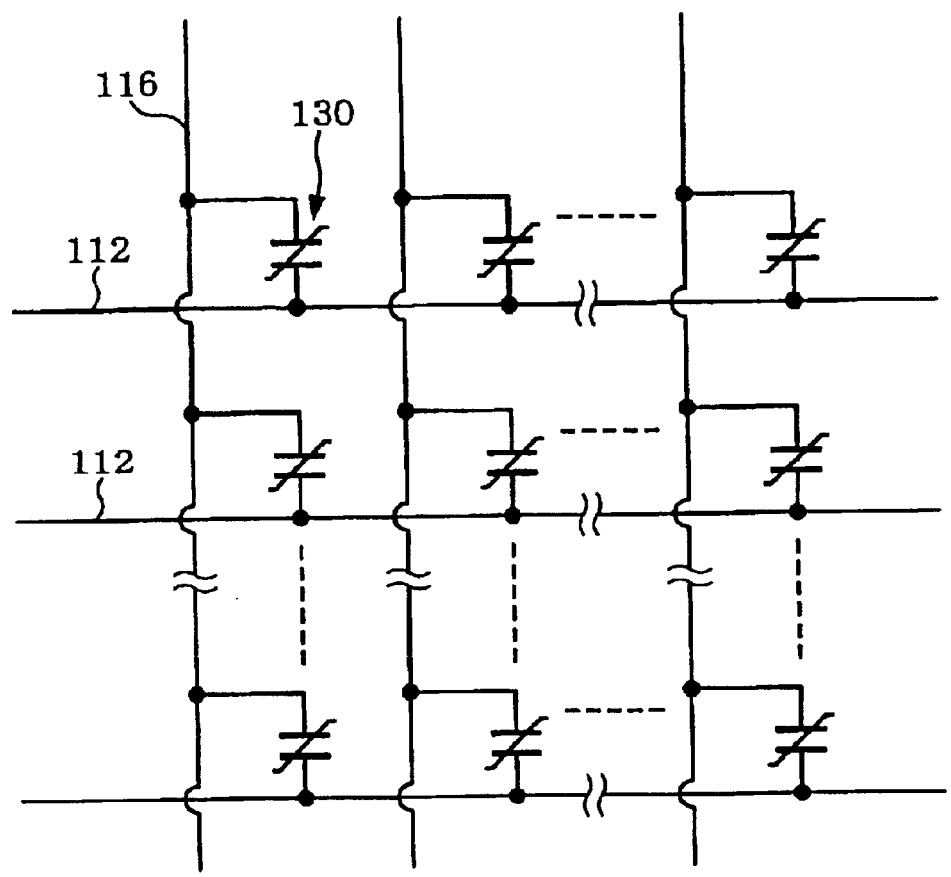
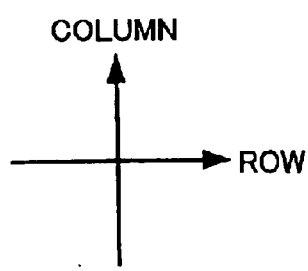

FERROELECTRIC MEMORY DEVICE

BACKGROUND OF THE INVENTION

1. Field of Invention

The present invention relates to ferroelectric memories and methods of manufacturing the same. More particularly, the invention relates to a ferroelectric memory device containing different types of ferroelectric memories and a method of manufacturing the same.

2. Description of Related Art

In general, a related art electronic apparatus (for example, a cellular phone) uses a plurality of and different types of memories (for example, having different speed properties). An exemplary combination of the different types of memories used for an electronic apparatus may include a SRAM or DRAM having high-speed performance and a flash memory.

However, there is almost no process consistency in the combination of the SRAM or DRAM and the flash memory. Accordingly, it is extremely difficult to fabricate the SRAM or DRAM and the flash memory on an identical substrate. In general, these types of memory are individually fabricated on substrates. Then, as shown in FIG. 17, a substrate 400 having a SRAM or DRAM and a substrate 410 having a flash memory are combined with each other in a mounting process.

SUMMARY OF THE INVENTION

The present invention provides a ferroelectric memory device facilitating the formation of a plurality of and different types of memories on an identical substrate, and a method of manufacturing the same.

1. Ferroelectric Memory Device

A ferroelectric memory device of the present invention includes: a first ferroelectric memory; and a second ferroelectric memory, the first ferroelectric memory including a first memory cell array, the second ferroelectric memory including a second memory cell array, memory cells arranged in a matrix manner in the first memory cell array, and the first memory cell array including first signal electrodes, second signal electrodes extending in the direction intersecting the first signal electrodes, and a ferroelectric layer disposed at least between the first signal electrodes and the second signal electrodes, and the second ferroelectric memory having a different type of memory cells from that of the memory cells of the first ferroelectric memory.

According to the present invention, the first memory cell array includes the first signal electrodes and the second signal electrodes extending in the direction intersecting the first electrodes, and the ferroelectric layer disposed at least between the first signal electrodes and the second signal electrodes. Hence, the first memory cell array is a so-called matrix-type ferroelectric memory cell array. The first memory cell array can therefore be formed on any insulating layer, and there is flexibility as to the choice of the region for forming the first memory cell array. As a result, in the ferroelectric memory device of the present invention, the first ferroelectric memory and the second ferroelectric memory can be easily formed on an identical substrate.

Each memory cell of the second ferroelectric memory may include a ferroelectric capacitor and a selection transistor. As a result, the first ferroelectric memory can function as a substitute for a flash memory and the second ferroelectric memory can function as a substitute for a SRAM or a DRAM.

The first ferroelectric memory may further include a peripheral circuit to drive the first memory cell array, and the peripheral circuit is disposed in a semiconductor layer having the selection transistor. In this instance, since the transistor of the peripheral circuit and the selection transistor can be formed in an identical process, process consistency between the first ferroelectric memory and the second ferroelectric memory can be enhanced. As a result, the first ferroelectric memory and the second ferroelectric memory can be easily formed using an identical substrate.

The first memory cell array of the first ferroelectric memory and the ferroelectric capacitors of the second ferroelectric memory may be disposed on an identical substrate. In this instance, since the first memory cell array and the ferroelectric capacitors can be formed in an identical process, process consistency between the first ferroelectric memory and the second ferroelectric memory can be enhanced. As a result, the first ferroelectric memory and the second ferroelectric memory can be easily formed on an identical substrate.

The first memory cell array of the first ferroelectric memory may be disposed above the second ferroelectric memory, and the first memory cell array may overlap the second ferroelectric memory when viewed from above. In this instance, the integration degree can be increased because it is not necessary to provide additional space to form the first ferroelectric memory.

The first memory cell array is provided thereabove with another memory cell array including the same memory cells as those in the first memory cell array. Consequently, the integration degree can be increased.

Each memory cell of the second ferroelectric memory may include: a gate electrode above a semiconductor layer with a ferroelectric layer therebetween, and a source region and a drain region in the semiconductor layer.

The first and second ferroelectric memories are disposed on a SOI substrate. The speed performance of the memory can be enhanced and the power consumption can be reduced.

2. Method of Manufacturing the Ferroelectric Memory Device

The present invention provides a method of manufacturing a ferroelectric memory device that includes: a first ferroelectric memory; and a second ferroelectric memory, the first ferroelectric memory including a first memory cell array, the second ferroelectric memory including a second memory cell array, the first memory cell array including first signal electrodes, second signal electrodes extending in the direction intersecting the first electrodes, and a ferroelectric layer disposed at least between the first signal electrodes and the second signal electrodes, the second memory cell array including memory cells, each including a ferroelectric capacitor and a selection transistor. The method includes: (a) forming the selection transistors of the second memory cell array; (b) forming the ferroelectric capacitors of the second memory cell array; and (c) forming the first memory cell array.

Steps (b) and (c) may be performed in the same process. Consequently, the number of steps can be reduced, and the first ferroelectric memory and the second ferroelectric memory can be easily formed on an identical substrate.

In the method of manufacturing the ferroelectric memory device, the first ferroelectric memory may further include a peripheral circuit formed in step (a). Consequently, the number of steps can be reduced, and the first ferroelectric memory and the second ferroelectric memory can be more easily formed on an identical substrate.

BRIEF DESCRIPTION OF THE DRAWINGS

FIG. 3 is an enlarged plan view of the first ferroelectric memory in FIG. 2;

FIG. 4 is a schematic of an equivalent circuit of a first memory cell array;

DETAILED DESCRIPTION OF PREFERRED EMBODIMENTS

1. Ferroelectric Memory Device

Figure 1:
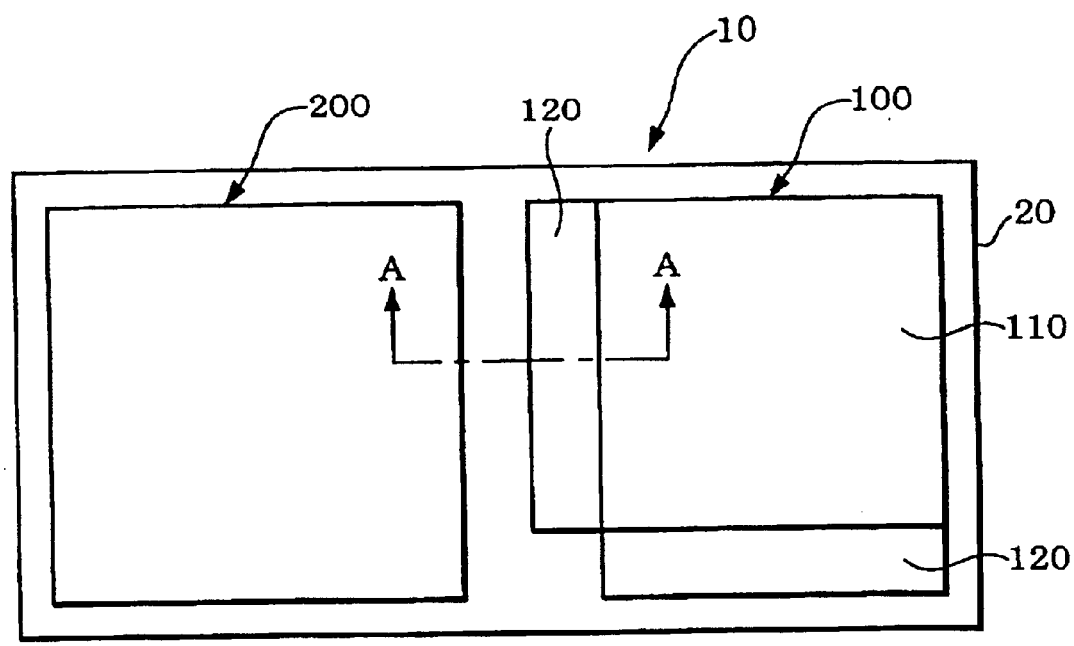
FIG. 1 is a schematic plan view of a ferroelectric memory device.
Figure 2:
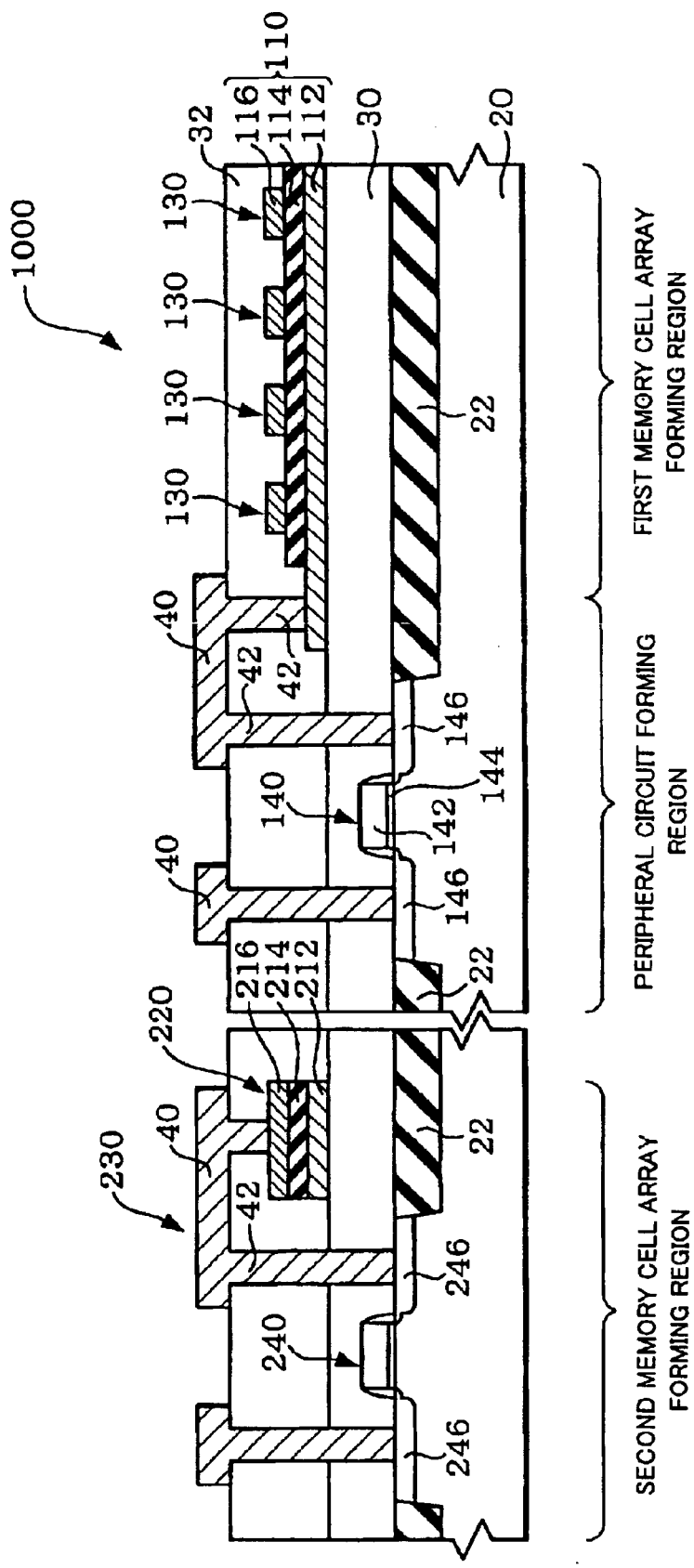
FIG. 2 is a schematic sectional view of principal parts taken along plane A—A in FIG. 1.

A ferroelectric memory device according to an exemplary embodiment of the present invention is described below. FIG. 1 is a schematic plan view of a ferroelectric memory device. FIG. 2 is a schematic sectional view of principal parts, taken along plane A—A in FIG. 1.

A ferroelectric memory device 10 includes a first ferroelectric memory 100 and a second ferroelectric memory 200, as shown in FIG. 1. The first ferroelectric memory 100 and the second ferroelectric memory 200 are disposed on an identical substrate 20. The first ferroelectric memory 100 is a matrix-type ferroelectric memory, and the second ferroelectric memory is a ferroelectric memory including selection transistors and ferroelectric capacitors. The substrate 20 may be a silicon substrate or a SOI substrate.

1.1 First Ferroelectric Memory

First, the first ferroelectric memory is described. FIG. 3 is an enlarged plan view of the first ferroelectric memory shown in FIG. 1. FIG. 4 is a schematic of an equivalent circuit of a first memory cell array.

The first ferroelectric 100 includes a first memory cell array 110 and peripheral circuits 120. Exemplary peripheral circuits 120 include a Y gate, a sense amplifier, an I/O buffer, an X address decoder, a Y address decoder, and an address buffer.

The first memory cell array 110 includes a plurality of first ferroelectric memories 130 arranged in the row and column directions, as shown in FIGS. 3 and 4. The first memory cell array 110 includes first signal electrodes 112, a ferroelectric layer 114, and second signal electrodes 116, as shown in FIGS. 2 and 3. The first memory cell array 110 may be disposed on a first insulating interlayer 30, as shown in FIG. 2.

As shown in FIG. 3, the first signal electrodes (word lines) 112 to select rows and the second signal electrodes (bit lines) 116 to select columns are orthogonal to each other. Specifically, the first signal electrodes 112 are arranged in the row direction at predetermined intervals, and the second signal electrodes 116 are arranged in the column direction, which is orthogonal to the row direction, at predetermined intervals. The ferroelectric layer 114 is disposed between the first signal electrodes 112 and the second signal electrodes 116, as shown in FIG. 2. Thus, the regions intersecting the first signal electrodes 112 and the second signal electrodes 116 form the first memory cells 130, which are ferroelectric capacitors. The first signal electrodes 112 may be bit lines and the second signal electrodes 116 may be word lines.

The peripheral circuits 120 include various types of circuits into which data is selectively written or from which data is read. The peripheral circuits 120, for example, include a driving circuit to selectively control the first signal electrodes 112, a driving circuit to selectively control the second signal electrodes 116, and a signal sensing circuit (not shown in the drawings), such as a sense amplifier.

Also, peripheral circuit transistors 140 constituting the peripheral circuits 200 are disposed on the substrate 20, as shown in FIG. 2. The peripheral circuit transistors 140 are field effect transistors (MOS transistors). Peripheral circuit transistors 140 are separated by element separation regions 22. Each peripheral circuit transistor 140 and the first memory cell array 110 are connected to each other with plugs 42 and a wiring layer 40.

1.2 Second Ferroelectric Memory

Figure 5:
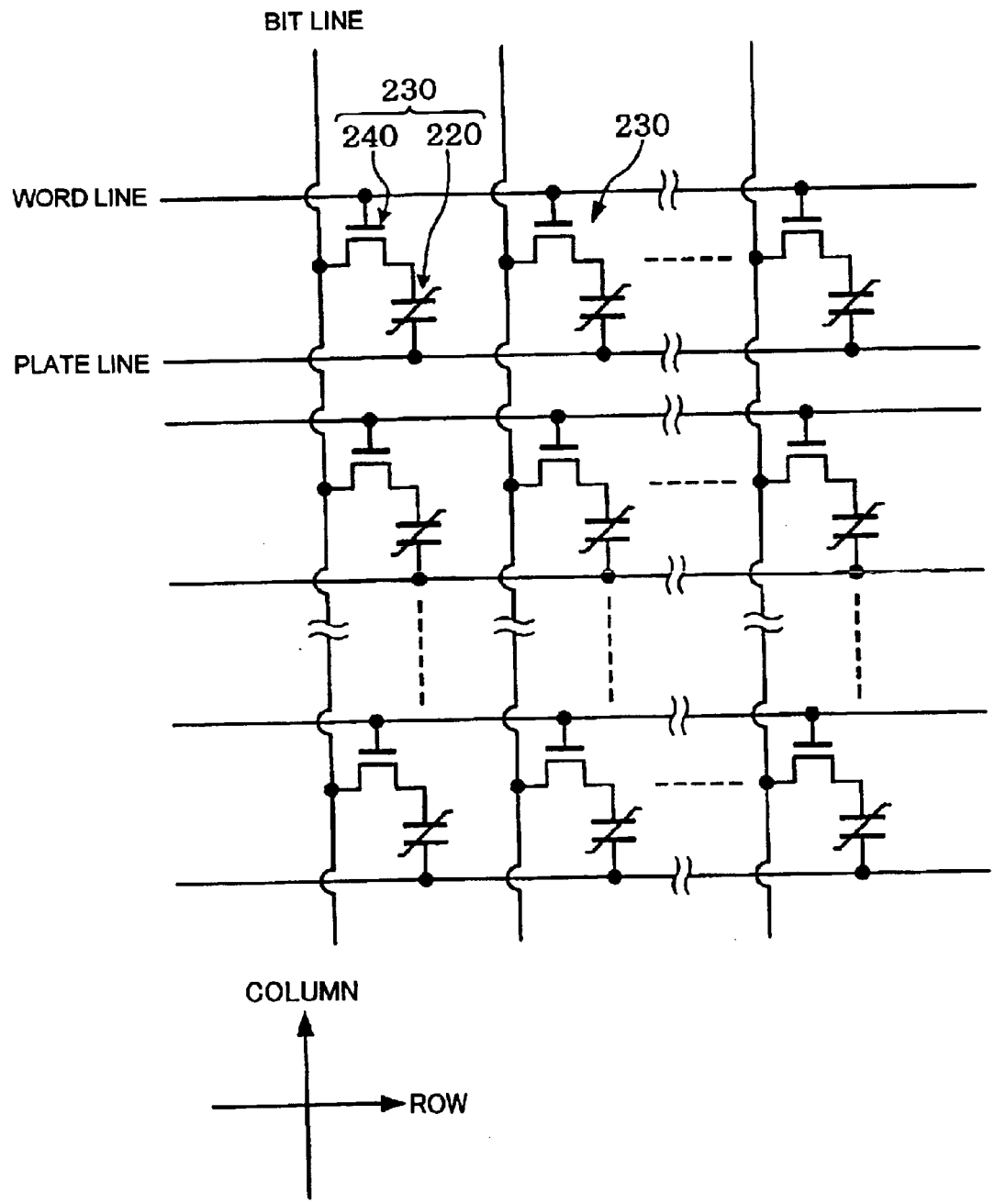
FIG. 5 is a schematic of an equivalent circuit of a second memory cell array.

The second ferroelectric memory is described below. FIG. 5 is a schematic of an equivalent circuit of the second memory cell array.

The second ferroelectric memory 200 includes a plurality of second ferroelectric memory cells 230 arranged in the row and column directions, as shown in FIG. 5. Each second memory cell 230 includes a selection transistor 240 and a ferroelectric capacitor 220, as shown in FIG. 2. The selection transistor 240 is formed on the substrate 20, and is, for example, a field effect transistor (MOS transistor). The ferroelectric capacitor 220 includes a lower electrode 212, a second ferroelectric layer 214, and an upper electrode 216 that are deposited in that order. The ferroelectric capacitor 220 is formed on the first insulating interlayer 30.

1.3 Effects

According to the above-described exemplary embodiment, the following effects can be achieved.

(1) The first memory cell array 110 of the first ferroelectric memory 100 and the ferroelectric capacitors 220 of the second memory cell array 210 are each disposed on the first insulating interlayer 30. Both the first memory cell array 110 and the ferroelectric capacitors 220 of the second memory cell array 210 have a ferroelectric layer between two electrodes. The first memory cell array 110 and the ferroelectric capacitors 220 of the second memory cell array 210 can therefore be formed in an identical process. Also, the peripheral circuit transistors 140 of the first ferroelectric memory 100 and the selection transistors 240 of the second memory cell array 210 can be formed in an identical process. As a result, the first ferroelectric memory 100 and the second ferroelectric memory 200 have high process consistency.

Thus, the first ferroelectric memory 100 and the second ferroelectric memory 200 are readily formed on the same substrate 20, in the ferroelectric memory device 10 according to the exemplary embodiment of the present invention.

(2) The first ferroelectric memory 100, which is a matrix-type ferroelectric memory, can be formed on any insulating layer (including an element separation region). In other words, there is some flexibility as to the choice of the region for the formation. Therefore, the formation of the first ferroelectric memory 100 and the second ferroelectric memory 200 on an identical substrate is easier than the formation of a SRAM or DRAM and a flash memory on an identical substrate.

(3) The first ferroelectric memory 100, which is a matrix-type ferroelectric memory, can be highly integrated. Also, the second ferroelectric memory 200 including the selection transistors 240 and the ferroelectric capacitors 220 advantageously has a high switching speed. Accordingly, a highly integrated memory region and a high switching-speed memory region can be formed on the same substrate 20, in the ferroelectric memory device 10.

More specifically, the second ferroelectric memory 200 can function as a substitute for a SRAM or a DRAM, and the first ferroelectric memory 100 can function as a substitute for a flash memory. In particular, since the first ferroelectric memory 100 is a matrix-type ferroelectric substance, it can function as a substitute for a high-capacity flash memory.

(4) Since all the memories of the ferroelectric memory device 10 are ferroelectric, batteries that the SRAM or DRAM requires are not necessary for holding record. The ferroelectric memory device 10 therefore can reduce power consumption in comparison with the case using the SRAM or DRAM.

(5) The first ferroelectric memory 100 is a matrix-type ferroelectric memory, in which recording can be performed at a speed higher than that of a flash memory by 1 or 2 order of magnitude. Accordingly, by allowing the first ferroelectric memory 100 to function as a substitute for a flash memory, a memory working at a speed higher than that of the flash memory can be achieved.

(6) Data processed at a high speed in the first ferroelectric memory 100 can be written into the second ferroelectric memory 200.

1.4 Exemplary Comparative Example

In a ferroelectric memory device whose memories are all matrix-type, some regions thereof can be allowed to function as a substitute for the SRAM or DRAM, and the other regions can be allowed to function as a substitute for the flash memory. However, since the matrix-type ferroelectric memory has a large number of capacitors on the bit lines, it is subject to a drawback in that the switching speed is reduced, due to the capacity component of the capacitors, in comparison with that of the SRAM or DRAM. It is therefore difficult to allow some regions of the ferroelectric memory device whose memories are all matrix-type to function as a substitute for the SRAM or DRAM because of the speed.

In a ferroelectric memory device whose memories are all ferroelectric 1T1C memories, also, some regions thereof can be allowed to function as a substitute for the SRAM or DRAM, and the other regions can be allowed to function as a substitute for the flash memory. However, since 1T1C ferroelectric memories or the like have a limit of integration, it is difficult to allow these memories to function as a substitute for a high-capacity flash memory. This is because the selection transistors of the 1T1C memory need to be disposed in the vicinity of the capacitors, and consequently, the integration degree is reduced.

2. Method of Manufacturing the Ferroelectric Memory Device

FIGS. 6 to 12 are schematic sectional views of steps of manufacturing a ferroelectric memory device.

Figure 6:
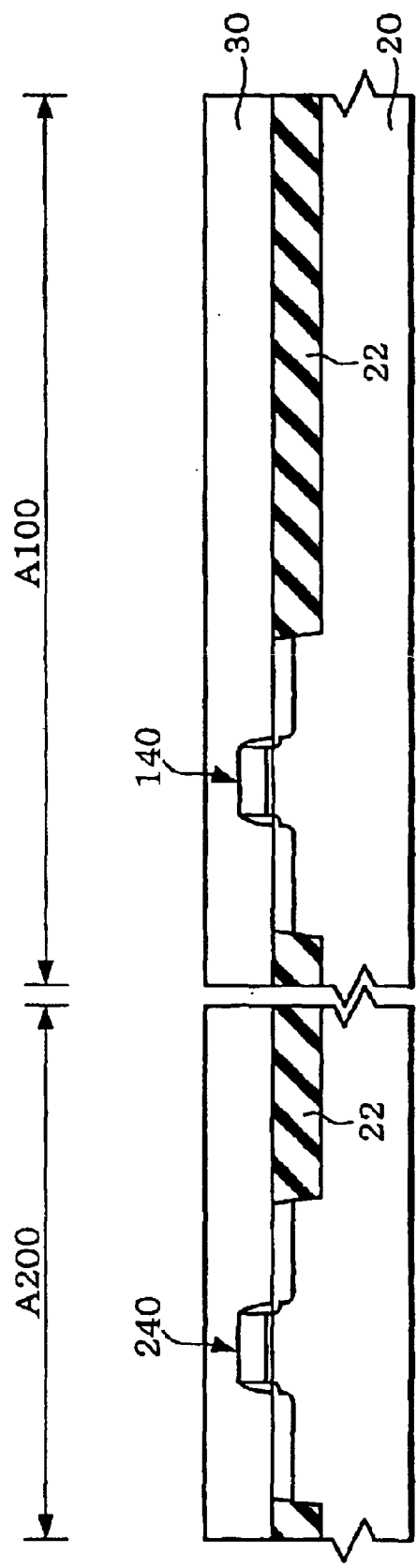
FIG. 6 is a schematic sectional view of a step for manufacturing a ferroelectric memory device.

First, as shown in FIG. 6, the peripheral circuit transistors 140 are formed on the substrate 20 in a region A100 of forming the first ferroelectric memory, and the selection transistors 240 are simultaneously formed on the substrate 20 in a region A200 of forming the second ferroelectric memory, using a related art or known LSI process (CMOS semiconductor process). Since the selection transistors 240 and the peripheral circuits 140 generally include respective field effect transistors, they can be formed in an identical process.

Next, the first insulating interlayer (for example, a silicon oxide layer) 30 is deposited on the substrate 20 by a related art or known method. The first insulating interlayer 30 is planarized by chemical and mechanical grinding, if necessary.

Figure 7:
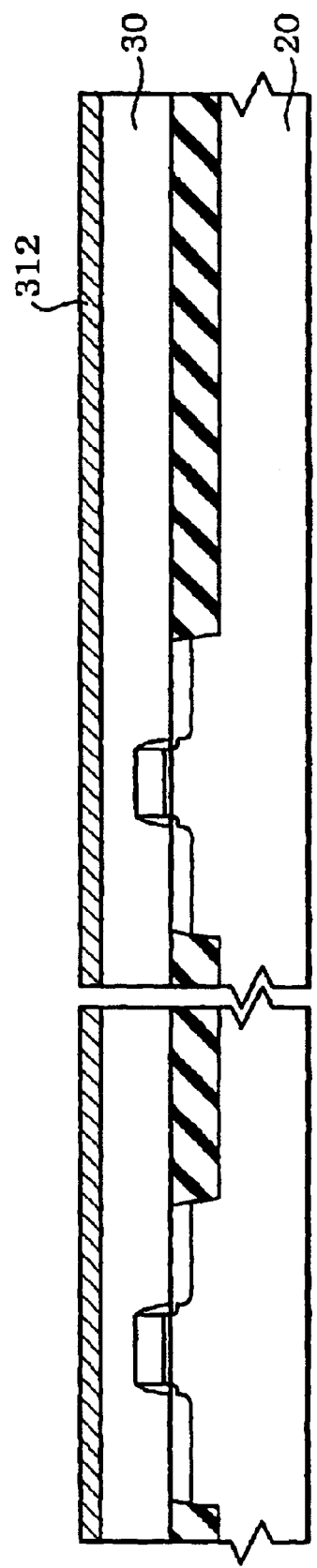
FIG. 7 is a schematic sectional view of a step for manufacturing a ferroelectric memory device.

As shown in FIG. 7, a first electrode layer 312 is deposited on the entire surface of the first insulating interlayer 30. The material of the first electrode layer 312 is not particularly limited as long as it can form the electrode of the ferroelectric capacitors. Exemplary constituents of the first electrode layer 312 include elemental metals of Pt, Ir, and Ru and their complex metals and alloys. More specifically, Ir, IrOx, Pt, RuOx, SrRuOx, and LaSrCoOx can be used. The constituent of the first electrode layer 312 may be a substance containing Pt and $SiO_2$, a substance containing Pt and Ta, or a substance containing Pt and $Y_2O_3$.

The first electrode layer 312 may be composed of a single layer or a plurality of layers. The first electrode layer 312 may be formed by sputtering, vacuum deposition, CVD, or the like.

Figure 8:
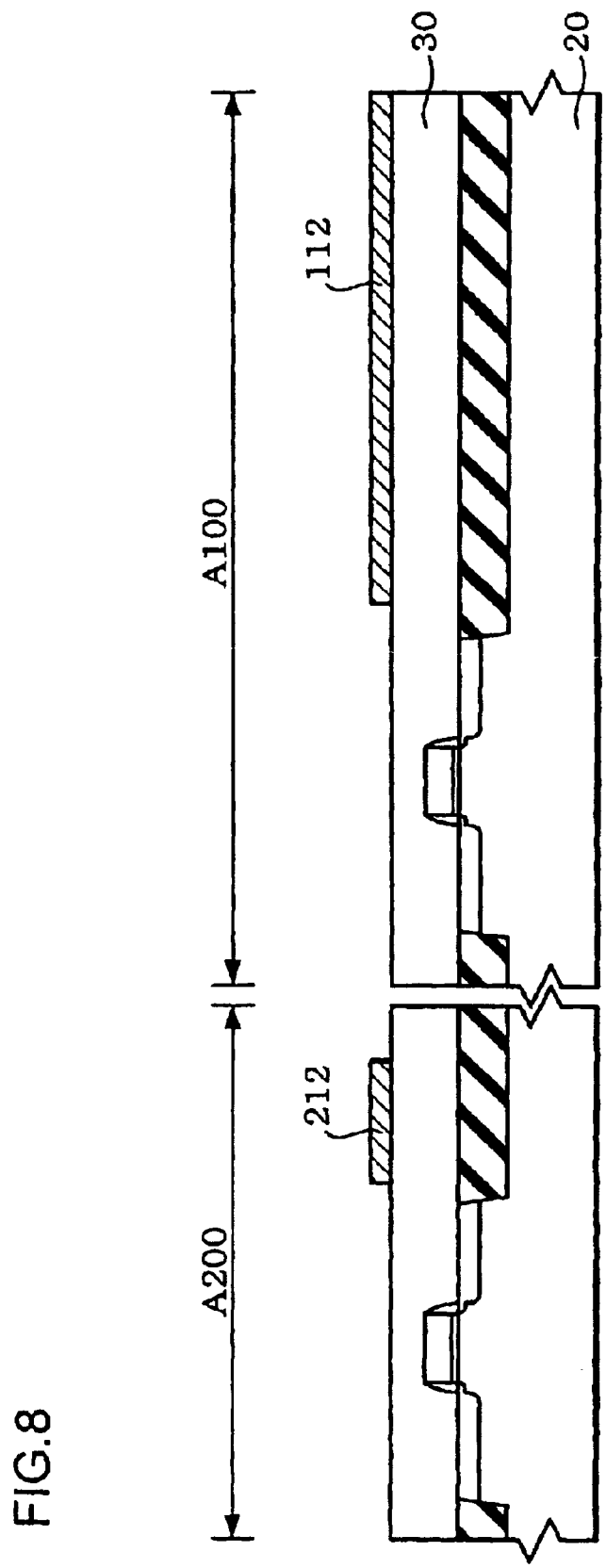
FIG. 8 is a schematic sectional view of a step for manufacturing a ferroelectric memory device.

Next, the first electrode layer 312 is subjected to patterning by photolithography and etching, as shown in FIG. 8. Specifically, the first signal electrodes 112 are formed in the first ferroelectric memory-forming region A100, and the lower electrodes 212 are formed in the second ferroelectric memory-forming region A200.

Figure 9:
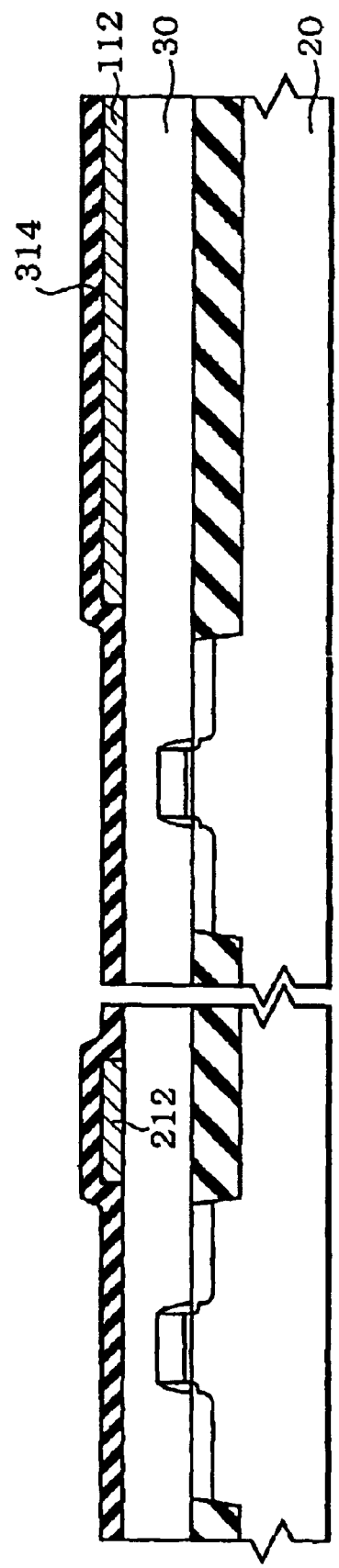
FIG. 9 is a schematic sectional view of a step for manufacturing a ferroelectric memory device.

As shown in FIG. 9, a ferroelectric layer 314 is deposited on the entire surface. The ferroelectric layer 314 can be formed of any material as long as it can function as a capacitor-insulating layer exhibiting ferroelectric characteristics. Such ferroelectric materials include perovskite (for example, SBT and BLT) and PZT, and these materials may further include a metal, such as niobium, nickel, or magnesium. The ferroelectric layer 314 may be formed by spin coating and dipping using a sol-gel material or a MOD material, sputtering, LSMCD, MOCVD, or laser ablation. It is needed to select a material and a deposition method that facilitate angulation, for the ferroelectric capacitors (matrix-type capacitors) of the first ferroelectric memory 100. In the case of using SBT or BLT, the crystal is, preferably, oriented in the a-axis direction. In the case of using PZT, the crystal is, preferably, oriented, for example, in the 111, 110, or 001 direction. More preferably, the PZT has a tetragonal structure oriented in the 110 direction. Preferably, the layer is formed by a sol-gel method or MOCVD, which facilitate control of the orientation of crystals.

Figure 10:
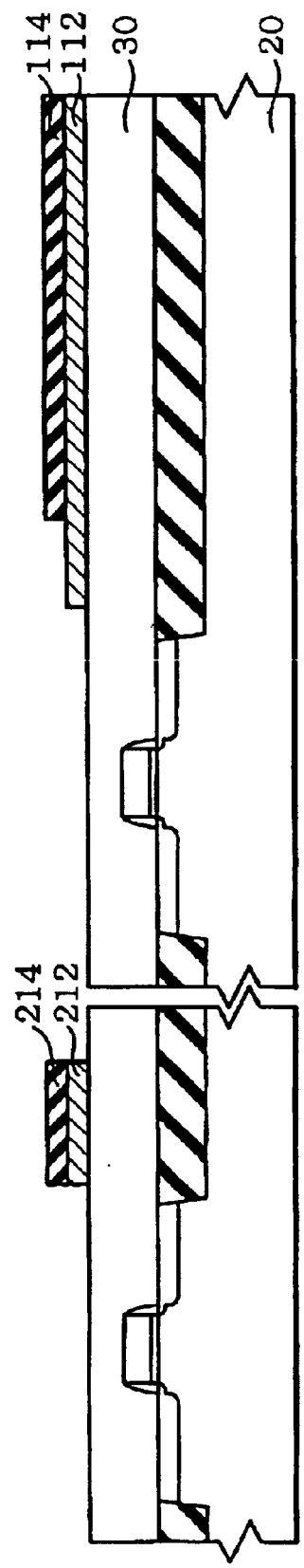
FIG. 10 is a schematic sectional view of a step for manufacturing a ferroelectric memory device.

The ferroelectric layer 314 is subjected to patterning by photolithography and etching, as shown in FIG. 10. Specifically, the ferroelectric layer 114 is formed on the first signal electrodes 112 and the ferroelectric layer 214 is formed on the lower electrodes 212.

Figure 11:
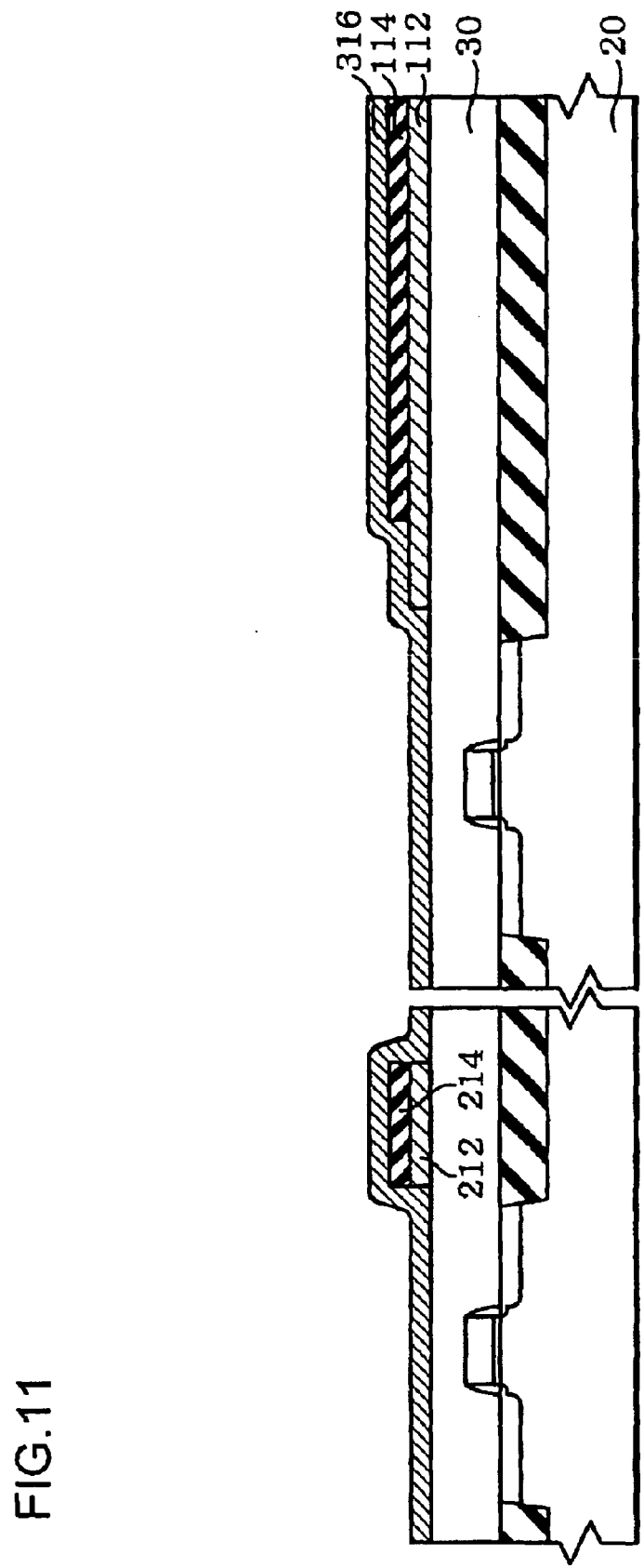
FIG. 11 is a schematic sectional view of a step for manufacturing a ferroelectric memory device.

Next, as shown in FIG. 11, a second electrode layer 316 is deposited on the entire surface. The second electrode layer 316 may be formed of the same material as in the description of the first electrode layer 312.

Figure 12:
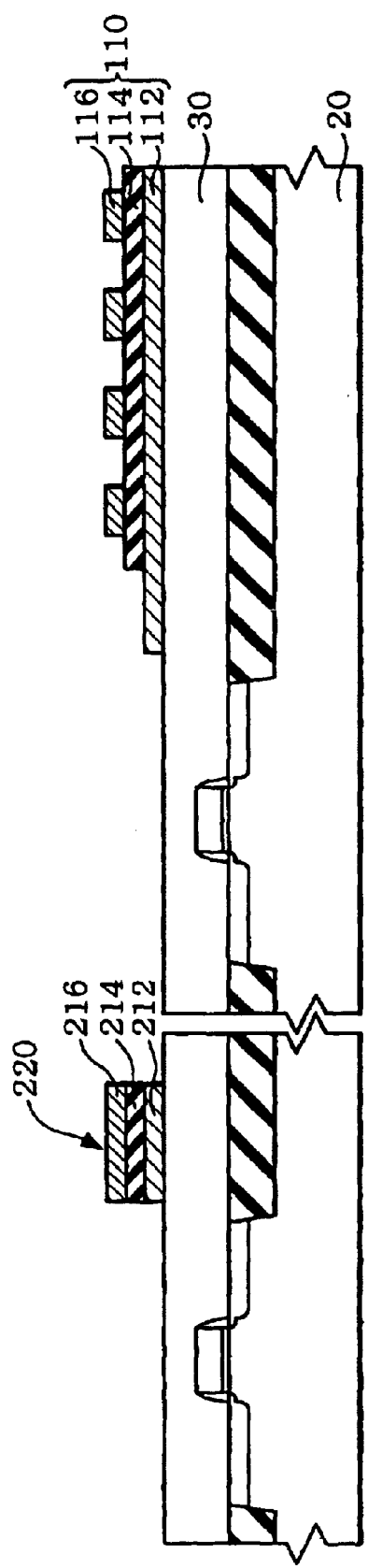
FIG. 12 is a schematic sectional view of a step for manufacturing a ferroelectric memory device.

The second electrode layer 316 is subjected to patterning by photolithography and etching, as shown in FIG. 12. Specifically, the second signal electrodes 116 are formed on the ferroelectric layer 114 and the upper electrodes 216 are formed on the ferroelectric layer 214. Thus, the first memory cell array 110 and the second memory cell array 210 including the ferroelectric capacitors 220 and the selection transistors 240 are completed.

Next, the second insulating interlayer (for example, a silicon oxide layer) 32 is deposited on the entire surface by a known method, as shown in FIG. 2. Next, source/drain regions 146 and 246 and the plugs (for example, tungsten plugs) 42 reaching the first memory cell array 110 and the ferroelectric capacitors 220 are formed in the first insulating interlayer 30 and the second insulating interlayer 32. Next, the wiring layer 40 is formed in a predetermined pattern on the second insulating interlayer 32 by a related art or known method. The wiring layer 40 may be formed of a metal, such as Al, Cu, or Pt or a nitride, such as TiN or, TiAlN. The deposition of the wiring layer 40 may be by sputtering.

A hydrogen barrier film may be formed so as to cover the first memory cell array 110 and the ferroelectric capacitors 220, before the formation of the second insulating interlayer 32. The hydrogen barrier film is formed of, for example, Al2O3, TiOx, SiN, or BiTiOx. This film can prevent hydrogen produced during passivation from reducing the ferroelectric material, thus reducing or suppressing the deterioration of characteristics.

Figure 13:
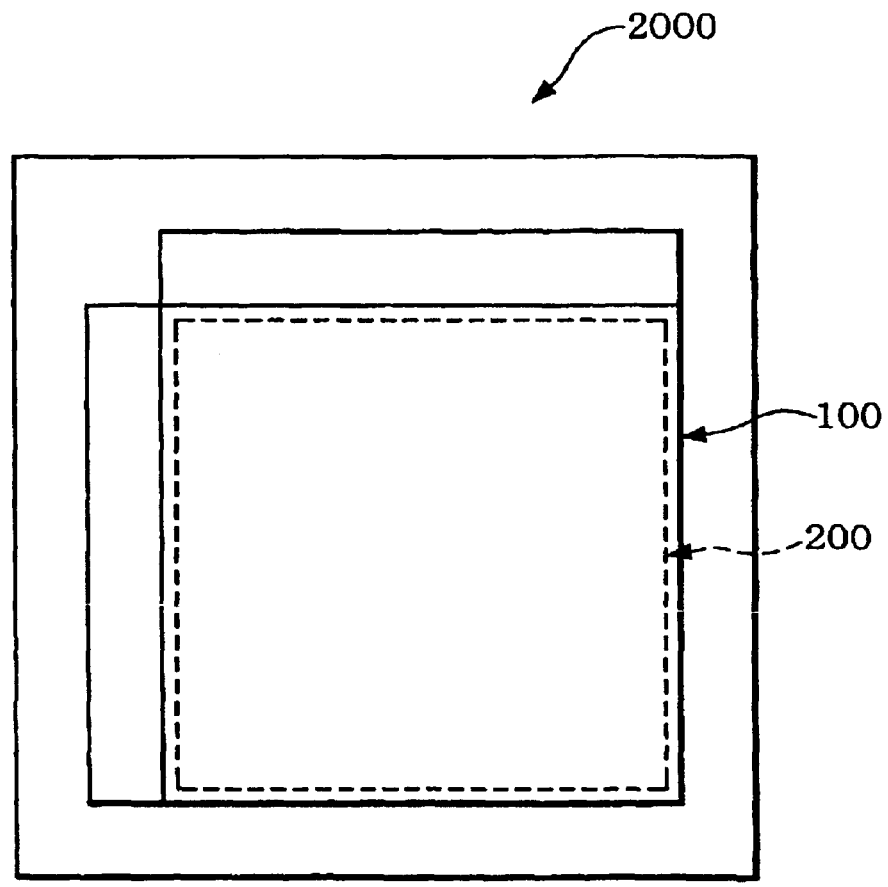
FIG. 13 is a schematic plan view of a ferroelectric memory device according to an exemplary modification.
Figure 14:
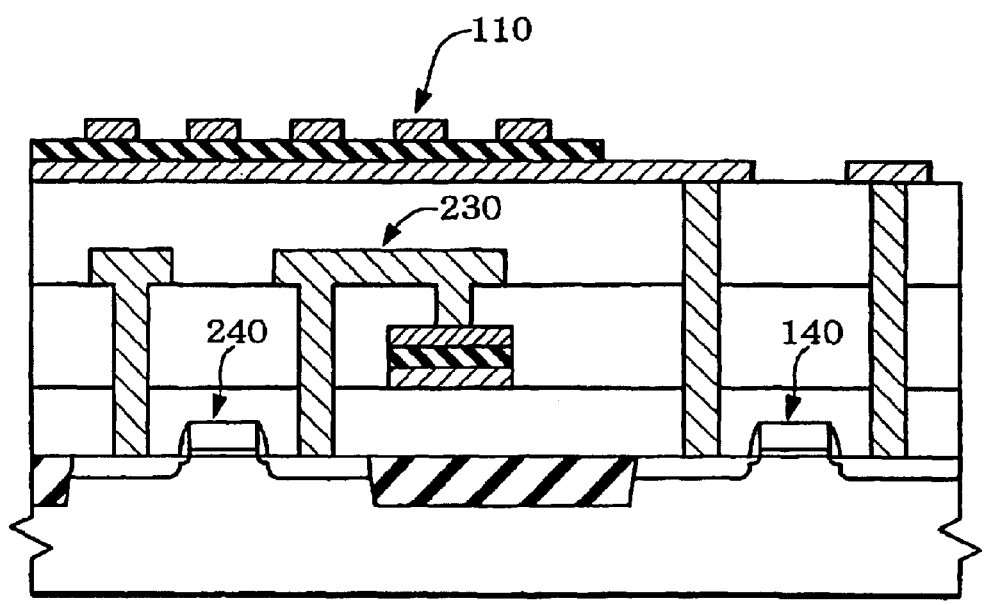
FIG. 14 is a schematic sectional view of a ferroelectric memory device according to an exemplary modification.

3. Exemplary Modifications (1) As shown in FIGS. 13 and 14, the first ferroelectric memory 100 may be formed in a different layer from that of the second ferroelectric memory 200. Specifically, the first ferroelectric memory 100 and the second ferroelectric memory 200 may be laid one upon the other when viewed from above. The ferroelectric memory 100 may overlie the second ferroelectric memory 200. More specifically, the first memory cell array 110 may be formed on the second memory cell array including the second ferroelectric memory cells 230, as shown in FIG. 14. In this instance, it is not necessary to provide additional space to form the first ferroelectric memory 200 in comparison with the case of the above-described exemplary embodiment. Consequently, the resulting ferroelectric memory device 2000 can be reduced in size or miniaturized and highly integrated.

In this instance, the selection transistors 240 of the second ferroelectric memory and the peripheral circuit transistors 140 of the first ferroelectric memory can be formed in an identical process. As a result, costs can be reduced and the consistency of the first ferroelectric memory and the second ferroelectric memory can be enhanced.

Figure 15:
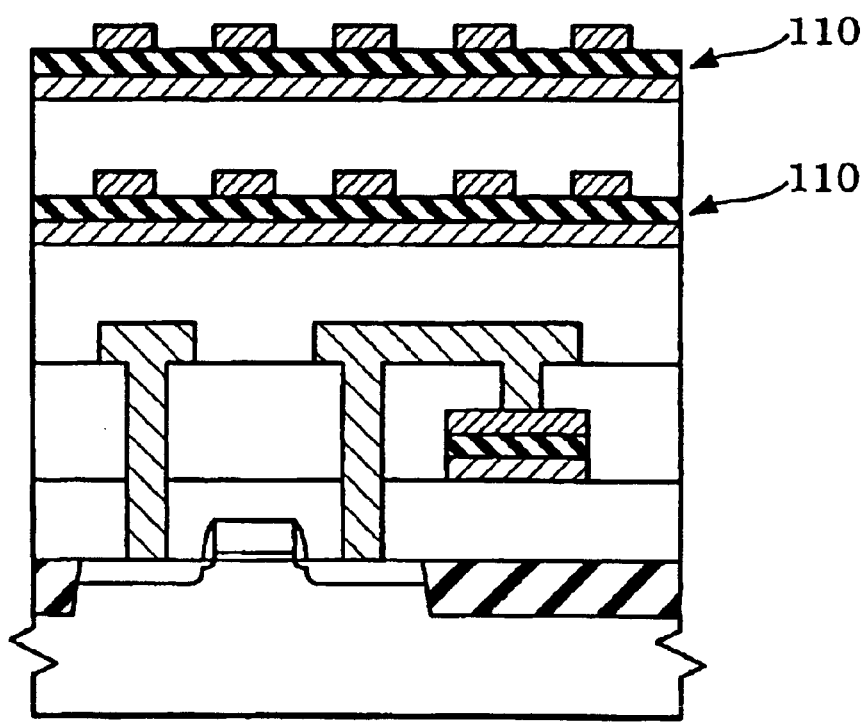
FIG. 15 is a schematic sectional view of a ferroelectric memory device according to an exemplary modification.

(2) As shown in FIG. 15, the first memory cell array 110 may be formed in a plurality of layers.

(3) The second ferroelectric memory cells are not limited to being 1T1C cells, and may be 2T2C cells.

Figure 16:
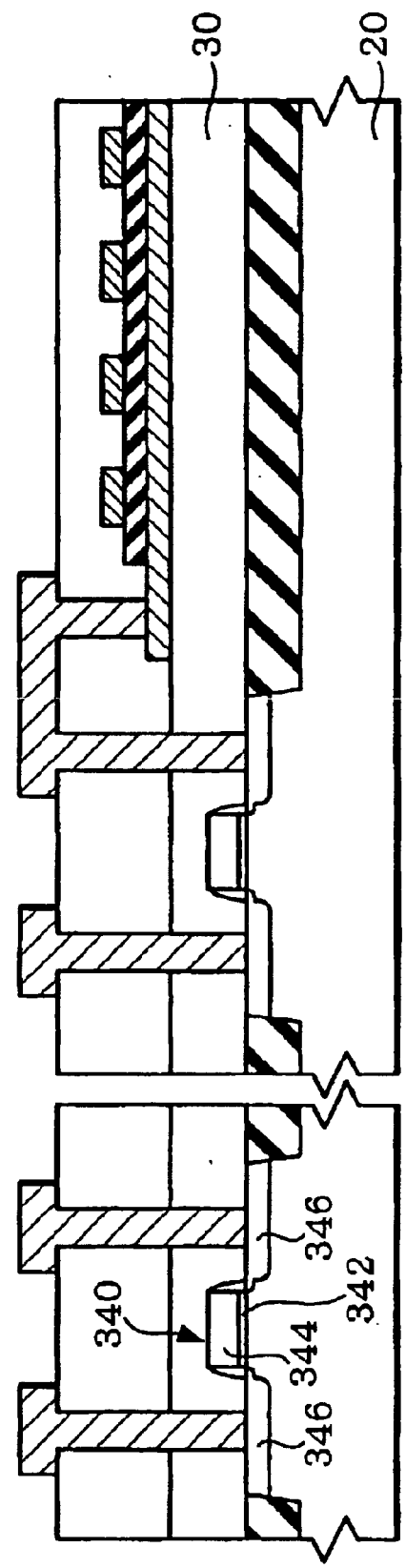
FIG. 16 is a schematic sectional view of a ferroelectric memory device according to an exemplary modification.
Figure 17:
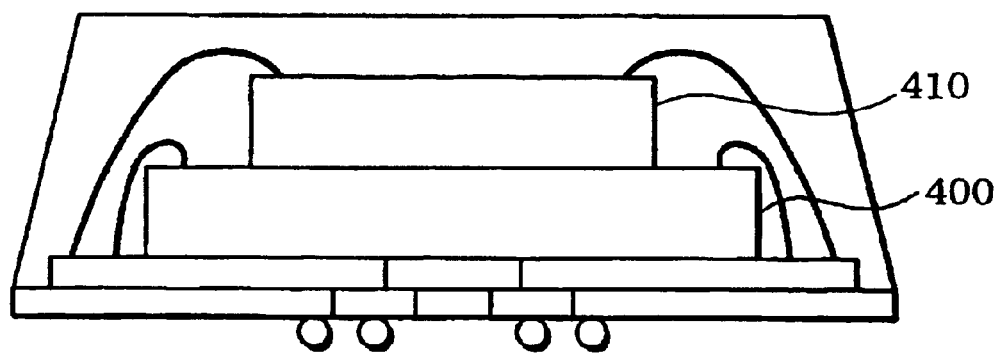
FIG. 17 is a sectional view of a known memory device containing a SRAM or a DRAM and a flash memory.

(4) The second ferroelectric memory cells may be MSF (metal-ferroelectric-semiconductor) FET ferroelectric memory cells, as shown in FIG. 16. Specifically, in each of the ferroelectric memory cells, a gate electrode 344 is disposed via a ferroelectric layer 342 and source/drain regions 346 are formed at both sides of the gate electrode 344.

(5) The substrate is not limited to being formed of silicon, and may be formed of SOI (silicon on insulator). The SOI substrate achieves the following effects.

In general, when noises are liable to occur, the capacity of capacitors (that is, the size of capacitors) to pick up output signals(output voltage) larger than noise signals must be large, and the number of cells on the bit lines must be reduced. On the other hand, noises can be reduced by providing the peripheral circuits on the SOI substrate. As noises are reduced, it is not necessary to reduce the number of the cells on the bit lines. Accordingly, integration can be facilitated. Also, by using the SOI substrate, the switching speed can be increased.

The SOI substrate is more expensive than the silicon substrate. However, by employing the matrix-type first memory cell array, high integration can be achieved and consequently the size of chips can be reduced. In addition, by using the first memory cell array, manufacturing costs can be reduced. From these points of view, the economical disadvantage of the SOI substrate can be reduced.

The present invention is not limited to the above-described exemplary embodiments, and various modifications can be made within the spirit and scope of the invention.

What is claimed is:

1. A ferroelectric memory device, comprising:

a first ferroelectric memory; and a second ferroelectric memory;

the first ferroelectric memory including a first memory cell array that includes memory cells;

the second ferroelectric memory including a second memory cell array that includes memory cells;

the memory cells being arranged in a matrix manner in the first memory cell array, and the first memory cell array including first signal electrodes, second signal electrodes extending in the direction intersecting the first electrodes, and a ferroelectric layer disposed at least between the first signal electrodes and the second signal electrodes; and the memory cells of the second ferroelectric memory being of a different type than the memory cells of the first ferroelectric memory.

2. The ferroelectric memory device according to claim 1, each memory cell of the second ferroelectric memory including a ferroelectric capacitor and a selection transistor.

3. The ferroelectric memory device according to claim 2, the first ferroelectric memory further including a peripheral circuit to drive the first memory cell array, and the peripheral circuit being disposed in a semiconductor layer having the selection transistor.

4. The ferroelectric memory device according to claim 1, the first memory cell array of the first ferroelectric memory and the ferroelectric capacitors of the second ferroelectric memory being disposed on an identical substrate.

5. The ferroelectric memory device according to claim 1, the first memory cell array of the first ferroelectric memory being disposed above the second ferroelectric memory, and the first memory cell array overlapping the second ferroelectric memory when viewed from above the device.

6. The ferroelectric memory device according to claim 1, the first memory cell array being provided thereabove with another memory cell array including the same memory cells as in the first memory cell array.

7. The ferroelectric memory device according to claim 1, each memory cell of the second ferroelectric memory including:

a gate electrode above a semiconductor layer with a ferroelectric layer therebetween, and a source region and a drain region in the semiconductor layer.

8. The ferroelectric memory device according to claim 1, the first and second ferroelectric memories being disposed on a SOI substrate.

* * * * *